(12) United States Patent
Takizawa

(10) Patent No.: US 7,625,222 B2
(45) Date of Patent: *Dec. 1, 2009

(54) PRINTED CIRCUIT BOARD, METHOD OF MANUFACTURING A PRINTED CIRCUIT BOARD AND ELECTRONIC APPARATUS

(75) Inventor: Minoru Takizawa, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/948,717

(22) Filed: Nov. 30, 2007

(65) Prior Publication Data

US 2008/0286994 A1    Nov. 20, 2008

Related U.S. Application Data

(62) Division of application No. 11/586,785, filed on Oct. 26, 2006, now Pat. No. 7,314,378.

(30) Foreign Application Priority Data

Oct. 28, 2005   (JP)   .............................. 2005-314403

(51) Int. Cl.
    *H01R 12/00*   (2006.01)
(52) U.S. Cl. ......................... 439/83; 439/876; 174/260; 361/760; 361/761
(58) Field of Classification Search .................. 439/83, 439/876; 174/260; 361/760, 761
    See application file for complete search history.

(56) References Cited

U.S. PATENT DOCUMENTS

| 3,991,347 | A | * | 11/1976 | Hollyday | .................... 361/760 |
| 6,165,595 | A | * | 12/2000 | Kumagai et al. | ............. 428/209 |
| 7,314,378 | B2 | * | 1/2008 | Takizawa | ...................... 439/83 |
| 2001/0023781 | A1 | * | 9/2001 | Muramatsu et al. | ......... 174/260 |
| 2001/0042640 | A1 | | 11/2001 | Nakamura et al. | |
| 2002/0159243 | A1 | | 10/2002 | Ogawa et al. | |
| 2004/0016567 | A1 | * | 1/2004 | Yamasaki et al. | ............ 174/260 |
| 2006/0216972 | A1 | * | 9/2006 | Modinger | ..................... 439/83 |

FOREIGN PATENT DOCUMENTS

| JP | 10-41605 | 2/1998 |
| JP | 2004-63956 | 2/2004 |
| JP | 2004-200226 | 7/2004 |

* cited by examiner

*Primary Examiner*—Tho D Ta
(74) *Attorney, Agent, or Firm*—Knobbe, Martens, Olson & Bear, LLP

(57) ABSTRACT

According to one embodiment, a printed circuit board includes a wiring board, a through-hole mount device, and a surface mount device. The wiring board has a first surface, a second surface opposite to the first surface, and through holes. The through-hole mount device has leads. The leads are soldered inside the through holes so that the through-hole mount device is mounted on the first surface. The leads have distal ends positioned inside the through holes. An adhesive fills the region between the wiring board and the through-hole mount device. The adhesive fixes the through-hole mount device to the first surface. A surface mount device is soldered to the second surface and closes the through holes in which the leads are inserted.

9 Claims, 7 Drawing Sheets

PRINTED CIRCUIT BOARD, METHOD OF MANUFACTURING A PRINTED CIRCUIT BOARD AND ELECTRONIC APPARATUS

CROSS-REFERENCE TO RELATED APPLICATIONS

This application is a divisional of U.S. patent application Ser. No. 11/586,785 entitled "Printed Circuit Board, Method of Manufacturing a Printed Circuit Board and Electronic Apparatus," filed Oct. 26, 2006, now U.S. Pat. 7,314,378 which relates to and claims the benefit of priority from Japanese Patent Application No. 2005-314403, filed Oct. 28, 2005, the entire contents of which are incorporated herein by reference.

BACKGROUND OF THE INVENTION

1. Field of the Invention

One embodiment of the invention relates to a printed circuit board having a surface mount device and a through-hole mount device reflow-soldered to a wiring board, and to a method of manufacturing a printed circuit board of this type. The invention further relates to an electronic apparatus having a printed circuit board, such as a portable computer.

2. Description of the Related Art

Printed circuit boards are widely used in electronic apparatuses such as portable computers. A printed circuit board has a wiring board, through-hole mount devices having leads each, and surface mount devices.

The wiring board has a first surface, a second surface that faces away from the first surface. It has through holes that open at both the first surface and the second surface. The inner surface of each through hole is covered with a conductive plated layer. Two lands are formed on the first and second surfaces of the wiring board. One land surrounds the rim of one end of each through hole, and the other land surrounds the rim of the other end of the through hole. Both lands are electrically connected to the plated layer.

Each through-hole mount device has its leads inserted in the through holes. The leads are soldered in the through holes, whereby the through-hole mount device is mounted on the first or second surface of the wiring board. Each surface mount device is placed on one land and then soldered thereto, and is therefore mounted on the first or second surface of the wiring board.

To mount the through-hole mount devices and surface mount devices in high density on the wiring board, it is desirable to arrange them with the through holes located between them. In order to arrange them so, the surface mount devices are soldered to the lands that faces away from the through-hole devices, as is disclosed in, for example, Jpn. Pat. Appln. KOKAI Publication No. 10-41605.

As described in Publication No. 10-41605, the leads of the through-hole device pass through the holes and project from the second surface of the wiring board if the through-hole devices are mounted on the first surface of the wiring board. The distal ends of the leads are covered with solder fillets that flare toward the through holes. The circumferential edge of each solder fillet extends over one land.

Consequently, each surface mount device may interfere with the distal ends of the leads or the solder fillet when it is soldered to a land provided on the second surface of the wiring board. To prevent this interference, the diameter of the land must be increased to displace the surface mount device from the through holes along the diameter thereof. Inevitably, the surface mount device moves from the through hole. A large space should be provided around the through hole, so that the surface mount device may be arranged in it. This makes it difficult to arrange the through-hole mount devices and surface mount devices in high density on the wiring board.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENT

Various embodiments according to the invention will be described hereinafter with reference to the accompanying drawings. In general, according to one embodiment of the invention, a printed circuit board comprises a wiring board having through holes, a through-hole mount device having a lead, and a surface mount device. The lead is soldered in the through hole, whereby the through-hole mount device is mounted on a first surface of the wiring board. The lead has a distal end lying in the through hole. The surface mount device is soldered to a second surface of the wiring board, closing the through hole in which the lead is inserted. The second surface is opposite to the first surface.

The first embodiment of this invention will be described, with reference to FIGS. 1 to 7.

Figure 1:
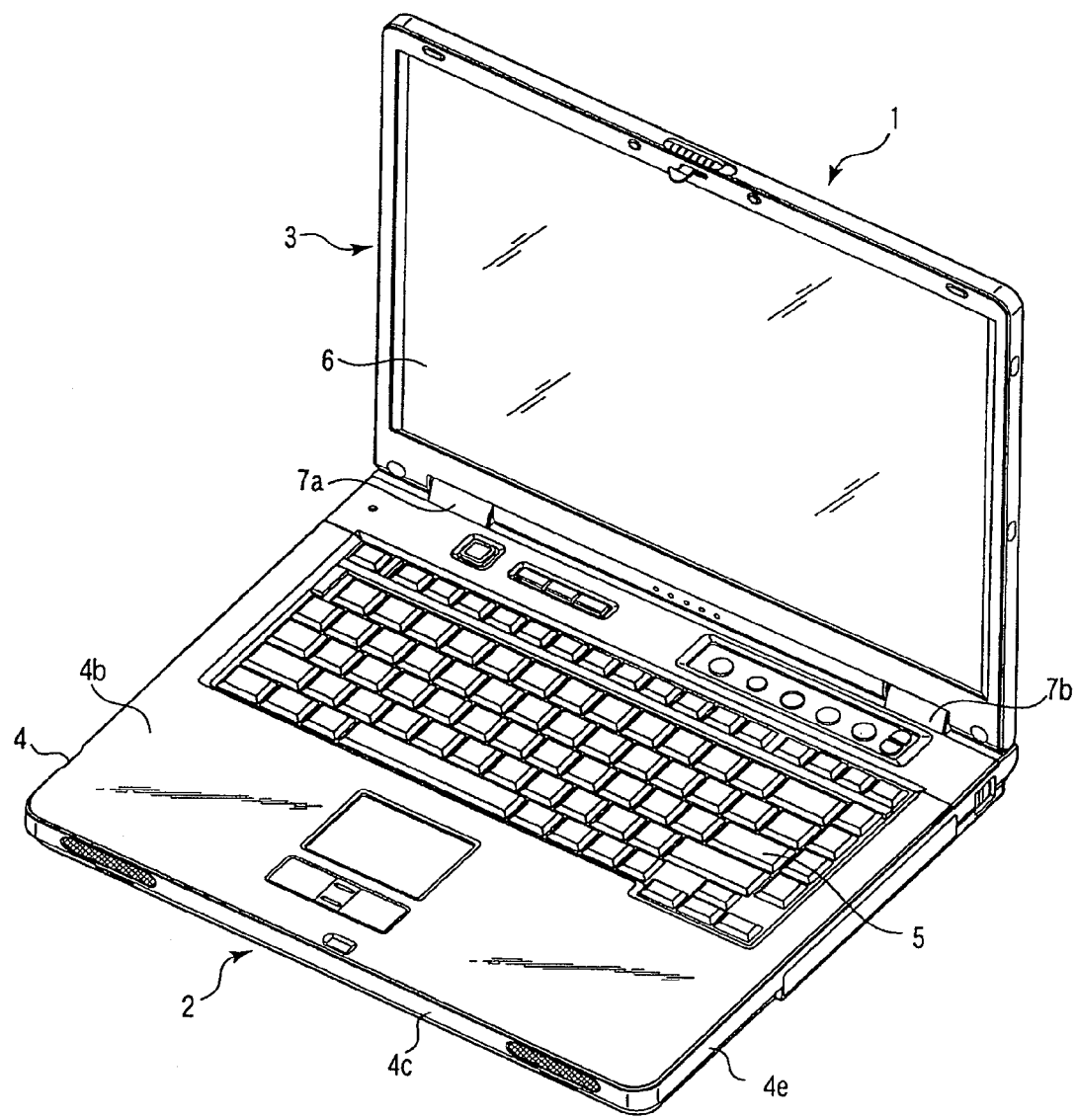
FIG. 1 is a perspective view of an exemplary portable computer according to a first embodiment of the present invention.
Figure 2:
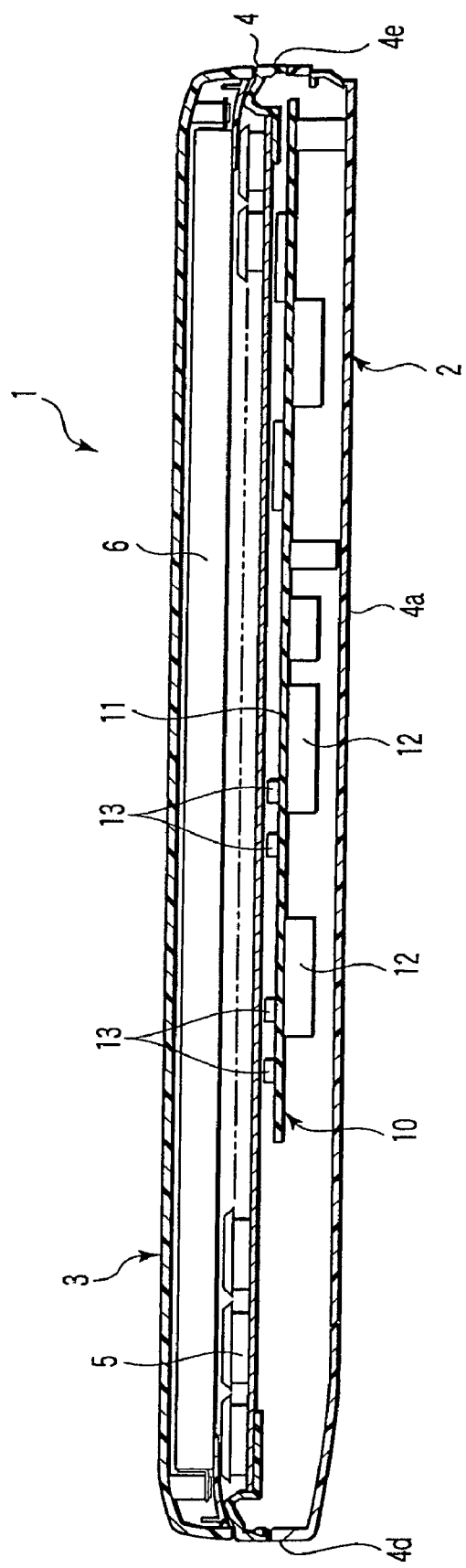
FIG. 2 is an exemplary sectional view of the portable computer according to the first embodiment of the invention.

FIGS. 1 and 2 show a portable computer 1 that is an electronic apparatus. The portable computer 1 comprises a main unit 2 and a display unit 3. The main unit 2 has a housing 4. The housing 4 is shaped like a flat box, having a bottom wall 4a, a top wall 4b, a front wall 4c, and left and right walls 4d and 4e. The top wall 4b of the housing 4 supports a keyboard 5.

The display unit 3 incorporates a liquid crystal display panel 6. A pair of hinges 7a and 7b supports the display unit 3 to the rear edge of the housing 4. The display unit 3 can be rotated between a closed position and an opened position. At the closed position, the display unit 3 lies on the housing 4, covering the keyboard 5 from above. At the opened position, the display unit 3 stands from the rear edge of the housing 4, exposing the keyboard 5.

As shown in FIG. 2, the housing 4 contains a printed circuit board 10. The printed circuit board 10 comprises a printed wiring board 11, a plurality of through-hole mount devices 12, and a plurality of surface mount devices 13.

Figure 3:
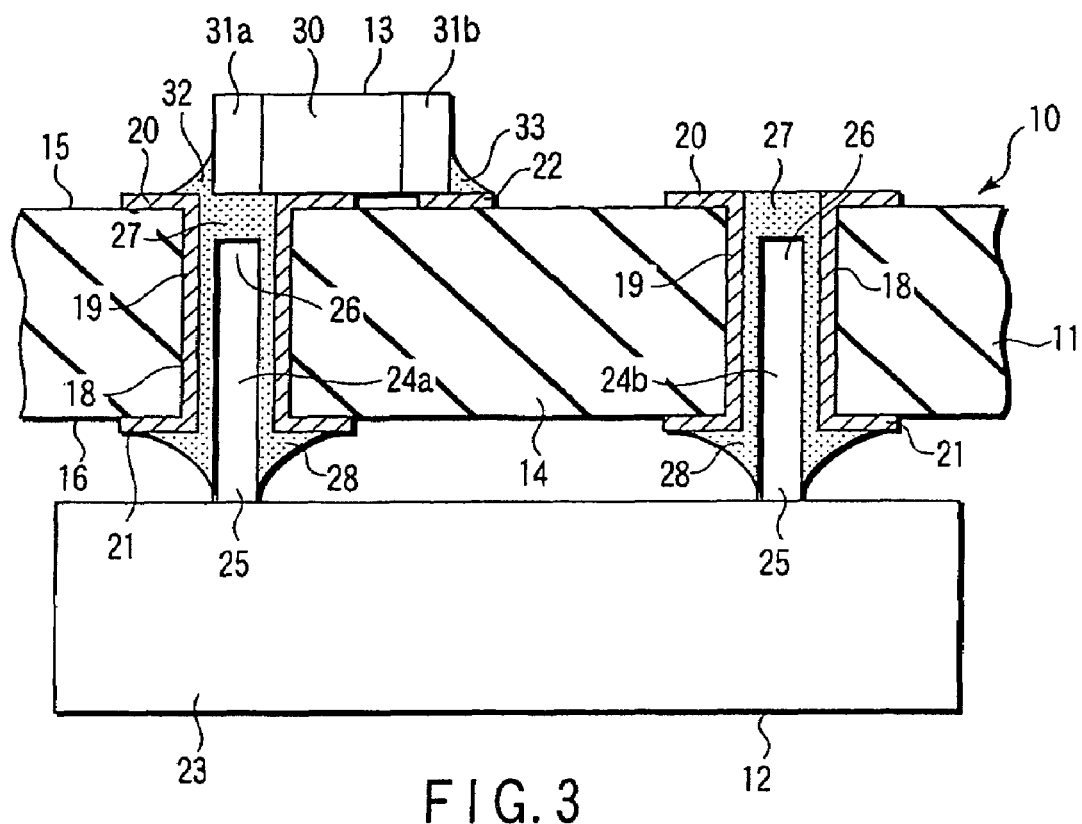
FIG. 3 is an exemplary sectional view of a printed circuit board according to the first embodiment of the invention.

As shown in FIG. 3, the printed wiring board 11 has an insulating base 14. The insulating base 14 has a first surface 15 and a second surface 16. The second surface 16 faces away from the first surface 15. The printed wiring board 11 is a double-sided printed wiring board that has conductor patterns on the first and second surfaces 15 and 16. The printed wiring board 11 is supported by the bottom wall 4a of the housing 4.

Nonetheless, the printed wring board 11 is not limited to a double-sided one. It may be, for example, a multilayer printed-wiring board having conductor patterns in the insulating base 14.

The printed wiring board 11 has a plurality of through holes 18. The through holes 18 penetrate the insulating base 14, each opening at both the first surface 15 and the second surface 16. The inner surface of each through hole 18 is covered with a conductive plated layer 19.

A plurality of lands 20 are formed on the first surface 15 of the insulating base 14. Similarly, a plurality of lands 21 are formed on the second surface 16 of the insulating base 14. The lands 20 and 21 are parts of the conductor patterns. They are shaped like a ring, each surrounding the rim of a through hole 18. The lands 20 and 21 are electrically connected to the plated layers 19 provided in the through holes 18.

Pads 22 are formed on the first surface 15 of the insulating base 14. The pads 22 are electrically connected to the conductor patterns, each located adjacent to one land 20.

The through-hole mount devices 12 are, for example, connectors that receive a large force to its junction with the printed wiring board 11. As shown in FIG. 3, each through-hole mount device 12 has a main body 23 and a pair of leads 24a and 24b. The leads 24a and 24b project from the main body 23. The leads 24a and 24b extend parallel to each other and are spaced apart from each other. They have a proximal end 25 and a distal end 26 each. The proximal end 25 is adjacent to the main body 23. The distal end 26 is remote from the main body 23.

The leads 24a and 24b of each through-hole mount device 12 are inserted in two adjacent through holes 18, from the second surface 16 of the printed wiring board 11. The leads 24a and 24b are reflow-soldered in the through holes 18. The through-hole mount device 12 is thus mounted on the second surface 16 of the printed wiring board 11.

As FIG. 3 depicts, the gaps between the leads 24a and 24b and the plated layers 19 provided in the through holes 18 are filled with solder 27 and the proximal ends 25 of the leads 24a and 24b project from the second surface 16 of the printed wiring board 11, once the through-hole mount device 12 has been mounted on the second surface 16. A solder fillet 28 is formed between the proximal end 25 of each lead and one land 21 provided on the second surface 16.

The distal ends 26 of the leads 24a and 24b lie in the through holes 18 below the first surface 15 of the printed wiring board 11. In other words, the leads 24a and 24b are soldered in the through holes 18, not passing through the holes 18.

The surface mount devices 13 are, for example, chip capacitors. They are lighter and smaller than each through-hole mount device 12. Each surface mount device 13 has a main body 30, a first electrode 31a, and a second electrode 31b. The first electrode 31a is provided on one end of the main body 30. The second electrode 31b is provided on the other end of the main body 30.

The surface mount device 13 is mounted on the first surface 15 of the printed wiring board 11 and extends over both the pad 22 and the through hole 18 in which one lead 24a is inserted.

The first electrode 31a of the surface mount device 13 is reflow-soldered to the land 20 provided at the through hole 18. The first electrode 31a closes that end of the through hole 18 which lies at the first surface 15 that faces away from the through-hole mount device 12. A solder fillet 32 connects the first electrode 31a to the land 20.

The second electrode 31b of the surface mount device 13 is reflow-soldered to the pad 22. A solder fillet 33 connects the second electrode 32b to the pad 22.

As shown in FIG. 3, the distal end 26 of the lead 24a is spaced from the first electrode 31a of the surface mount device 13 that is mounted on the printed wiring board 11, together with through-hole mount device 12. Solder 27 is filled in the gap between the first electrode 31a and the distal end 26 of the lead 24a.

A sequence of manufacturing the printed circuit board 10 will be explained, with reference to FIGS. 4 to 7.

A printed wiring board 11 having through holes 18 and pads 22 is prepared first. The printed wiring board 11 is held in position, with its first surface 15 turned up. Solder paste is applied, by printing, to the lands 20 and the pads 22 that are provided on the first surface 15 of the printed wiring board 11.

To apply the solder paste by printing, a screen mask of the known type is used. The screen mask has openings. The screen mask is laid on the first surface 15 of the printed wiring board 11, with the openings aligned with the lands 20 and the pads 22. Solder paste is applied into the openings of the screen mask, by using a squeegee. The solder paste is thereby transferred to the lands 20 and the pads 22.

Figure 4:
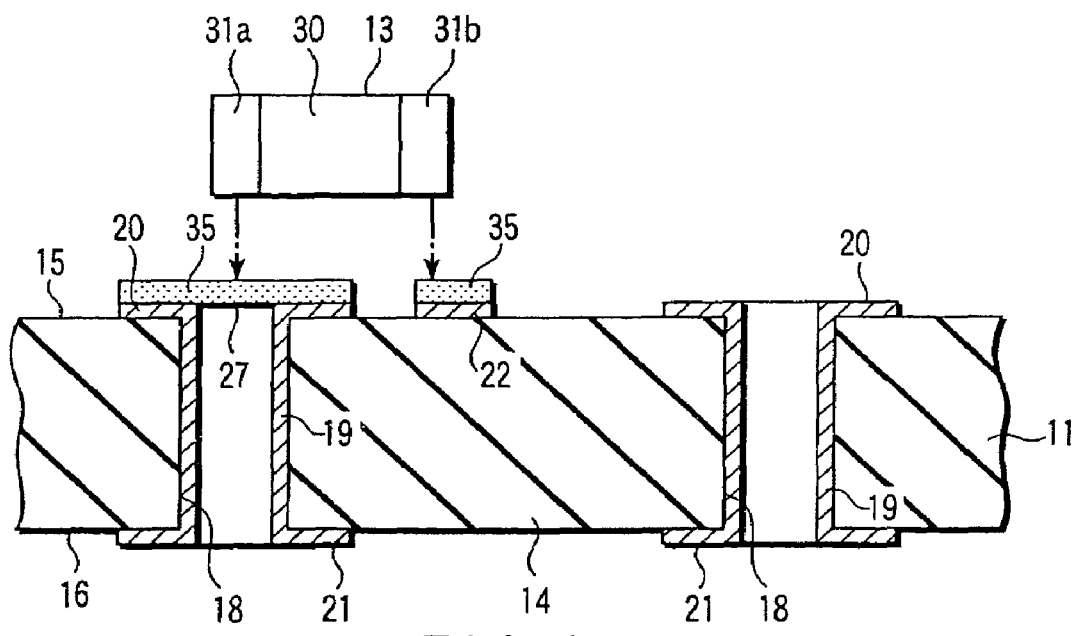
FIG. 4 is an exemplary sectional view of a wiring board of the printed circuit board, showing how solder paste is applied to the first surface of the wiring board and how a surface mount device is mounted on the solder paste layer.
Figure 5:
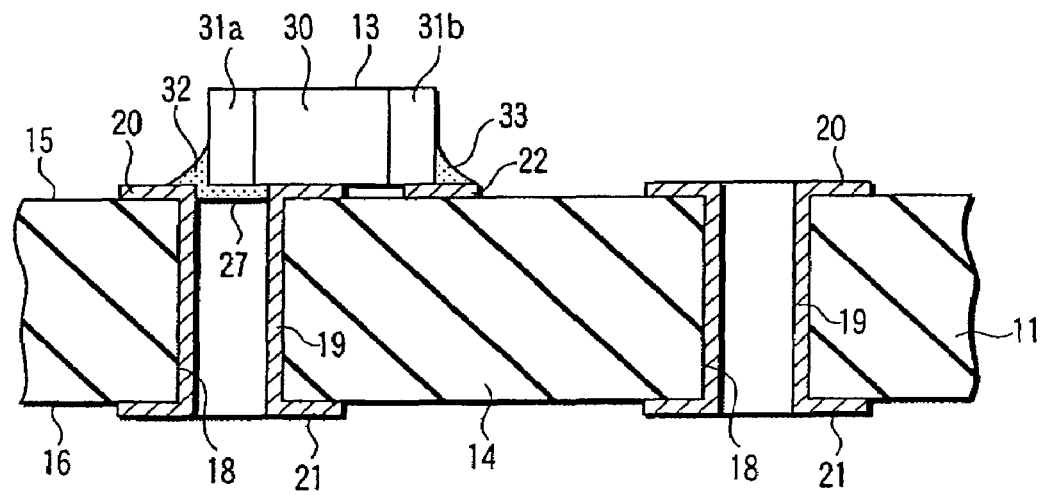
FIG. 5 is an exemplary sectional view of the wring board, showing the surface mount device that is reflow-soldered to the first surface of the wiring board in the first embodiment of the present invention.

Thus, the solder paste is applied to the lands 20 and pads 22 that are provided on the first surface 15 as illustrated in FIG. 4. The solder paste thus applied form solder layers 35, which covers the lands 20 and the pads 22.

Next, surface mount devices 13 are placed on the first surface 15 of the printed wiring board 11, by using, for example, a part-mounting apparatus. Each surface mount device 13 is positioned, with the first electrodes 31a and second electrode 31b mounted on one land 20 and one pad 22, respectively. The first electrode 31a lies right above one through hole 18 and closes this through hole 18 at the first surface 15.

The printed wiring board 11, which now has the surface mount devices 13 mounted on it, is heated in a reflow furnace.

The solder layers 35 melt, filling the gap between each first electrode 31a and one land 22 and the gap between each second electrode 31b and one pad 22. A part of the molten solder flows along each first electrode 31a into one through hole 18.

Thereafter, the printed wiring board 11 is taken from the reflow furnace. It is left to stand and cooled, solidifying the molten solder. As a result, solder fillets 32 are formed, some between the first electrodes 31a and the lands 20 and the others between the second electrodes 31b and the pads 22. Further, that end of each through hole 18, which lies below the first electrode 31a, is closed with solder 27. Thus, the first and second electrodes 31a and 31b of each surface mount device 13 are soldered to one land 20 and one pad 22, respectively. The surface mount devices 13 are thereby mounted on the first surface 15 of the printed wiring board 11.

Figure 6:
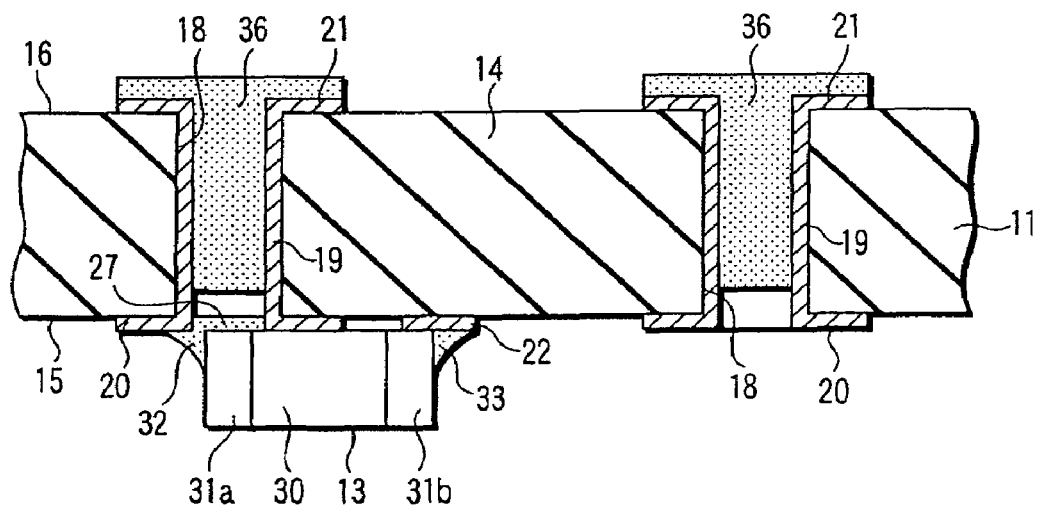
FIG. 6 is an exemplary sectional view of the wiring board, depicting solder paste applied to the second surface of the wiring board in the first embodiment of the invention.

Next, the printed circuit board 11 is turned upside down as shown in FIG. 6. The second surface 16 is therefore turned upward. Solder paste is printed on the lands 21 provided on the second surface 16, by using a screen mask of the known type and a squeegee. The solder paste is thereby applied to the lands 21 and into the through holes 18. As a result, the lands 21 are covered with solder layers 36 and the through holes 18 are filled with solder layers 36.

Figure 7:
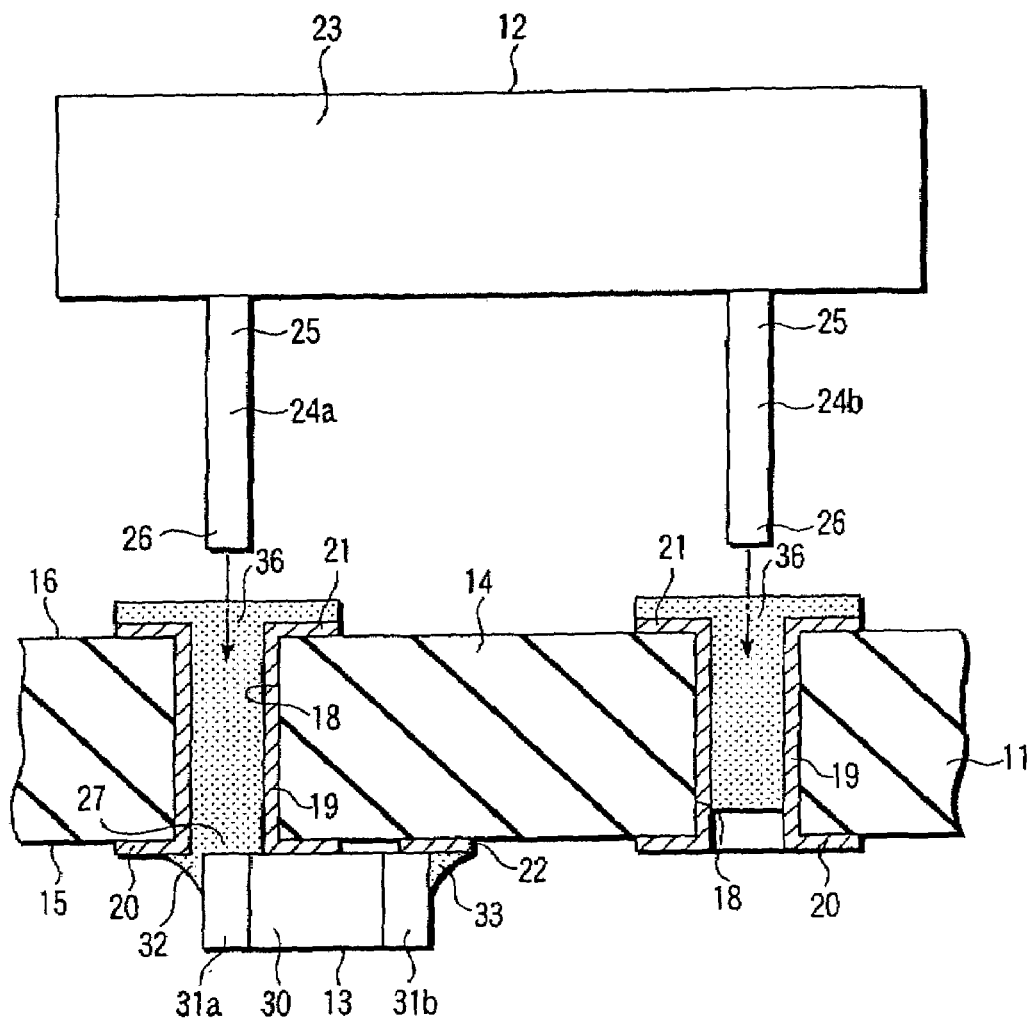
FIG. 7 is an exemplary sectional view of the wiring board, showing how the leads of a through-hole mount device are inserted into through holes filled with solder paste, in the first embodiment of the invention.

Upon completion of the application of solder paste, the leads 24a and 24b of each through-hole mount device 12 are inserted, respectively, into two through holes 18 filled with the solder paste, from the second surface 16 of the printed wiring board 11 as is illustrated in FIG. 7. At this time, the distal ends 26 of the leads 24a and 24b lie in the through holes 18, not projecting from the first surface 15.

Then, the printed wiring board 11 is heated again in the reflow furnace. The solder layers 36 therefore melt, filling the gap between the lead 24a and a played layer 19, the gap between the lead 24b and a played layer 19, and the gap between the distal end 26 of the lead 24a and the first electrode 31a of the surface mount devices 13.

Thereafter, the printed wiring board 11 is taken from the reflow furnace. It is left to stand and cooled, solidifying the molten solder. As a result, solder fillets 28 are formed as shown in FIG. 3, one between the proximal end 25 of the lead 24a and one land 21, and another between the lead 24b and another land 21. At the same time, the solder 27 fills the gap between the distal end 26 of the lead 24a and the first electrode 31a of the surface mount devices 13. The leads 24a and 24b of the through-hole mount device 12 are thereby soldered in the through holes 18. Thus, the through-hole mount device 12 is mounted on the second surface 16 of the printed wiring board 11.

In the first embodiment, the leads 24a and 24b of the through-hole mount device 12 lie in the through holes 18, not projecting from the first surface 15 of the printed wiring board 11.

Hence, the first electrode 31a of the surface mount device 13 can be soldered to the land 20 and close one end of the through hole 18. In other words, this end of the through hole 18 in which the lead 24a is inserted can be used as mounting region for the first electrode 31a.

The through-hole mount device 12 and the surface mount device 13 can therefore be arranged across the through hole 18. That is, they can be mounted in high density.

Since the solder 27 fills the distal end 26 of the lead 24a and the first electrode 31a, voids hardly develop in the through hole 18 when the through-hole mount device 12 and the surface mount device 13 are soldered to the printed wiring board 11. Even if the temperature of the printed circuit board 10 rises, the solder 27 will not peel off as in the case where air in the through hole 18 expands. This enhances the electrical connection between the printed wiring board 11 and the through-hole mount device 12 and the electrical connection between the printed wiring board 11 and the surface mount device 13.

The present invention is not limited to the first embodiment described above. Various changes and modifications can be made without departing from the scope and spirit of the invention.

Figure 8:
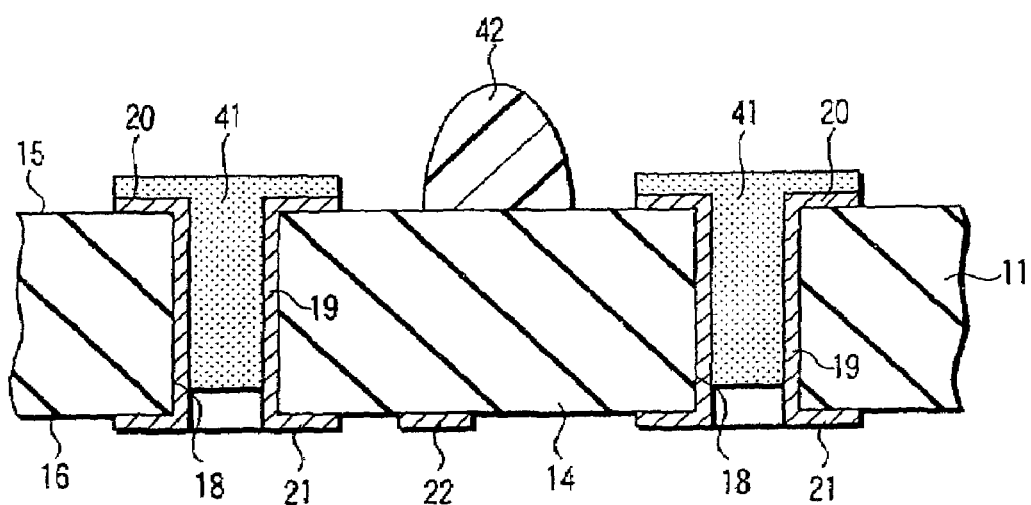
FIG. 8 is an exemplary sectional view of the wiring board used in a second embodiment of this invention, showing the solder paste applied into the through holes of the wiring board and the adhesive applied to the first surface of the wiring board.
Figure 9:
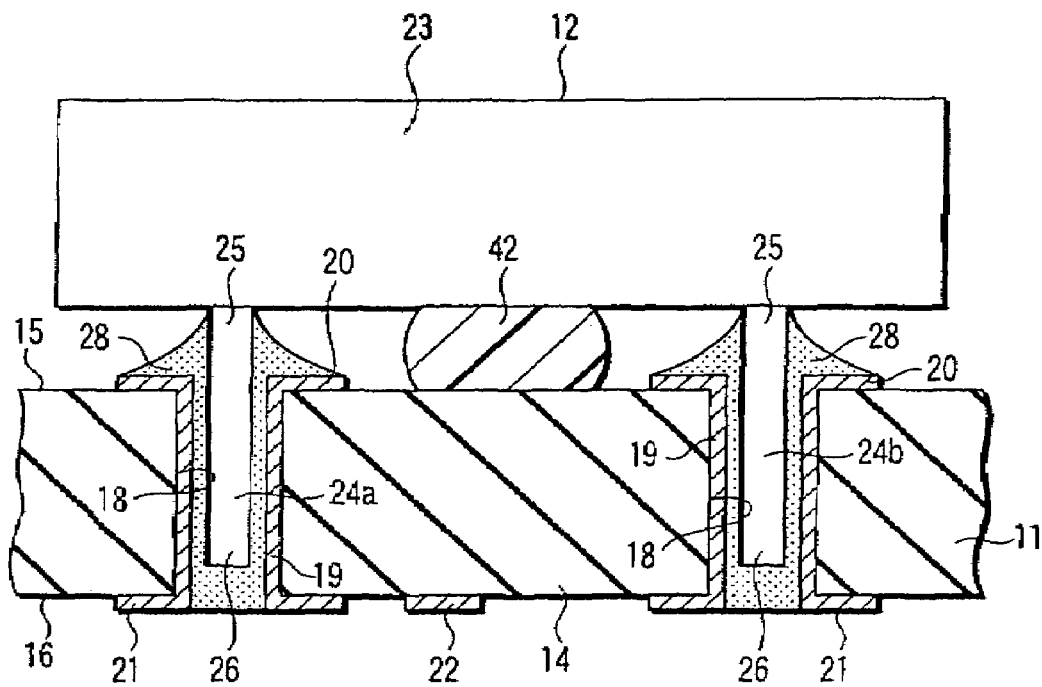
FIG. 9 is an exemplary sectional view of a printed circuit board according to the second embodiment of the invention, illustrating a through-hole mount device mounted on the first surface of the wiring board.
Figure 10:
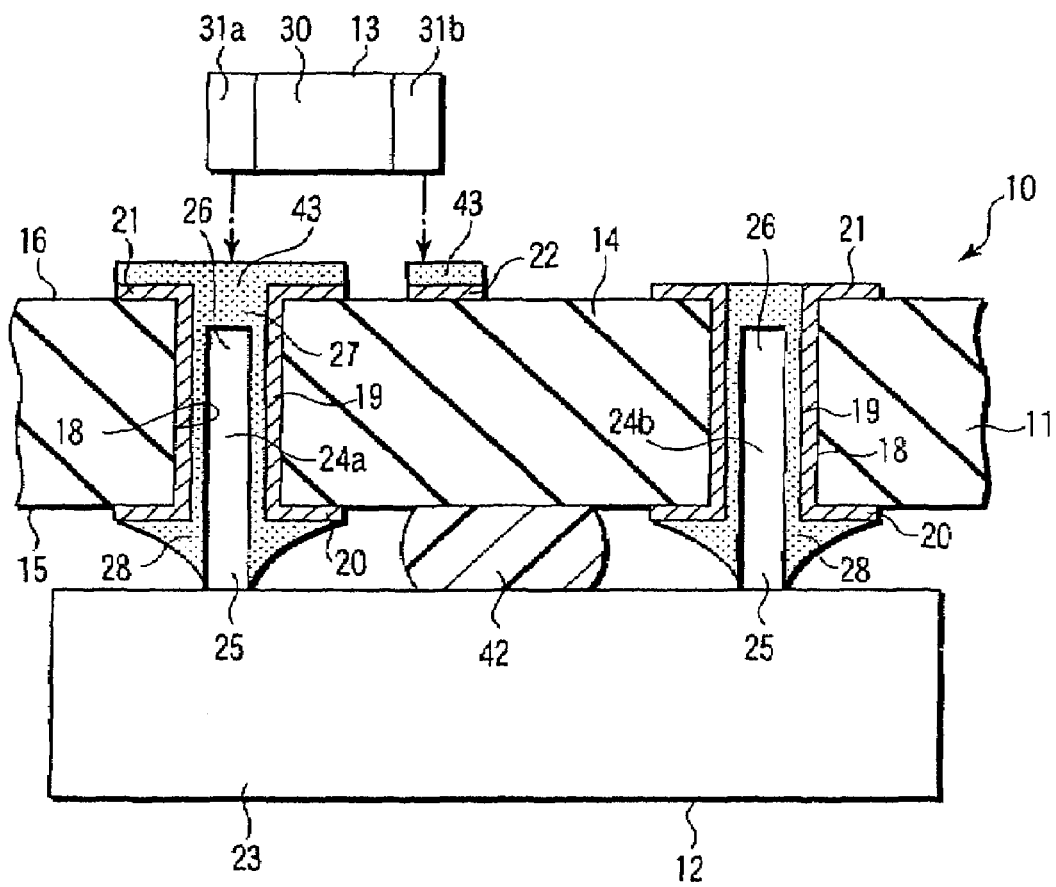
FIG. 10 is an exemplary sectional view of the wiring board used in the second embodiment of this invention, depicting the solder paste applied to the second surface of the wiring board and a surface mount device mounted on the solder paste.

FIGS. 8 to 10 show a second embodiment of this invention. The second embodiment differs from the first embodiment in that each though-hole mount device 12 and each surface mount device 13 are mounted on the first surface 15 and second surface 16 of the printed wiring board 11, respectively. In the second embodiment, the pads 22 are arranged on the second surface 16 of the printed wiring board 11.

To manufacture a printed circuit board 10 that is the second embodiment, the printed wiring board 11 is held, with the first surface 15 turned upward as shown in FIG. 8. Solder paste is applied, by printing, to the lands 20 provided on the first surface 15, by using a screen mask and a squeegee. The solder paste is applied not only to the lands 20, but also into the through holes 18 made in the printed wiring board 11. As a result, the lands 20 are thereby covered with solder layers 41 and the through holes 18 are filled with solder layers 41.

Upon completion of the application of solder paste, thermosetting adhesive 42 is applied to those regions of the first surface 15, in which the through-hole mount devices 12 will be arranged.

Next, as shown in FIG. 9, the leads 24a and 24b of each through-hole mount device 12 are inserted, respectively, into two through holes 18 that are filled with solder paste, from the first surface 15 of the printed wiring board 11. At this time, the distal ends 26 of the leads 24a and 24b lie in the through holes 18, not projecting from the second surface 16. The adhesive 42 fills the gap between the first surface 15 of the printed wiring board 11 and the main body 23 of the through-hole mount device 12.

The printed wiring board 11, which now has the through-hole mount devices 12 mounted on it, is heated in a reflow furnace. The solder layers 41 melt, filling the gap between the lead 24a and a plated layer 19, the gap between the lead 24b and another planted layer 19, the gap between the proximal end 25 of the lead 24a and one land 20, and the gap between the proximal end 25 of the lead 24b and another land 20. At the same time, the thermosetting adhesive 42 hardens, firmly holding the through-hole mount device 12 at a prescribed position on the first surface 15 of the printed wiring board 11.

Thereafter, the printed wiring board 11 is taken from the reflow furnace. It is left to stand and cooled, solidifying the molten solder. As a result, solder fillets 28 are formed as shown in FIG. 9, one between the proximal end 25 of the lead 24a and one land 20, and another between the lead 24b and another land 20. The leads 24a and 24b of the through-hole mount device 12 are thereby soldered in the through holes 18. Thus, the through-hole mount device 12 is mounted on the first surface 15 of the printed wiring board 11.

Next, the printed wiring board 11 is turned upside down as shown in FIG. 10. The second surface 16 is therefore turned upward. Solder paste is printed on the lands 21 and pads 22 provided on the second surface 16, by using a screen mask and a squeegee. The solder paste is thereby applied to the lands 21 and pads 22. As a result, the lands 21 and pads 22 are covered with solder layers 43.

Then, the surface mount devices 13 are placed on the second surface 16 of the printed wiring board 11, by using, for example, a part-mounting apparatus. Each surface mount device 13 is positioned, with the first electrodes 31a and second electrode 31b mounted on one land 20 and one pad 22, respectively. Note that the land 20 is provided on the rim of the through hole 18 in which the lead 24a of the through-hole mount device 12 is inserted. The first electrode 31a lies right above one through hole 18 and closes this through hole 18 at the second surface 16.

The printed wiring board 11 now having the surface mount devices 13 mounted on it, is heated in a reflow furnace. The solder layers 43 melt, filling the gap between each first electrode 31a and one land 21 and the gap between each second electrode 31b and one pad 22. A part of the molten solder flows along each first electrode 31a into one through hole 18.

Then, the printed wiring board 11 is taken from the reflow furnace. It is left to stand and cooled, solidifying the molten solder. As a result, solder fillets similar to those shown in FIG. 3 are formed, some between the first electrodes 31a and the lands 20 and the others between the second electrodes 31b and the pads 22. Further, that end of each through hole 18, which lies below the first electrode 31a, is closed with solder 27.

Thus, the first and second electrodes 31a and 31b of each surface mount device 13 are soldered to one land 21 and one pad 22, respectively. The surface mount devices 13 are thereby mounted on the second surface 16 of the printed wiring board 11.

In the second embodiment, too, the leads 24a and 24b of each through-hole mount device 12 lie in the through holes 18. Hence, neither the lead 24a nor the solder fillets 28 hinder the soldering of the first electrode 31a of each surface mount device 13 to one land 21. The open end of the through hole 18 in which the lead 24a is inserted can be used as a mounting region for the first electrode 31a.

Furthermore, when the screen mask is laid on the second surface 16 of the printed wiring board 11, it contacts the second surface 16 of the printed wiring board 11 because the leads 24a and 24b of each through-hole mount device 12 lie in two through holes 18, respectively. Therefore, the solder paste can be applied reliably to prescribed regions of the second surface 16, though the through-hole mount devices 12 have been mounted before the surface mount devices 13.

In addition, the screen mask does not interfere with the distal ends 26 of the leads 24a and 24b. This prevents the screen mask from being deformed or damaged. As a result, the screen mask can have a long lifetime and can be used many times.

Figure 11:
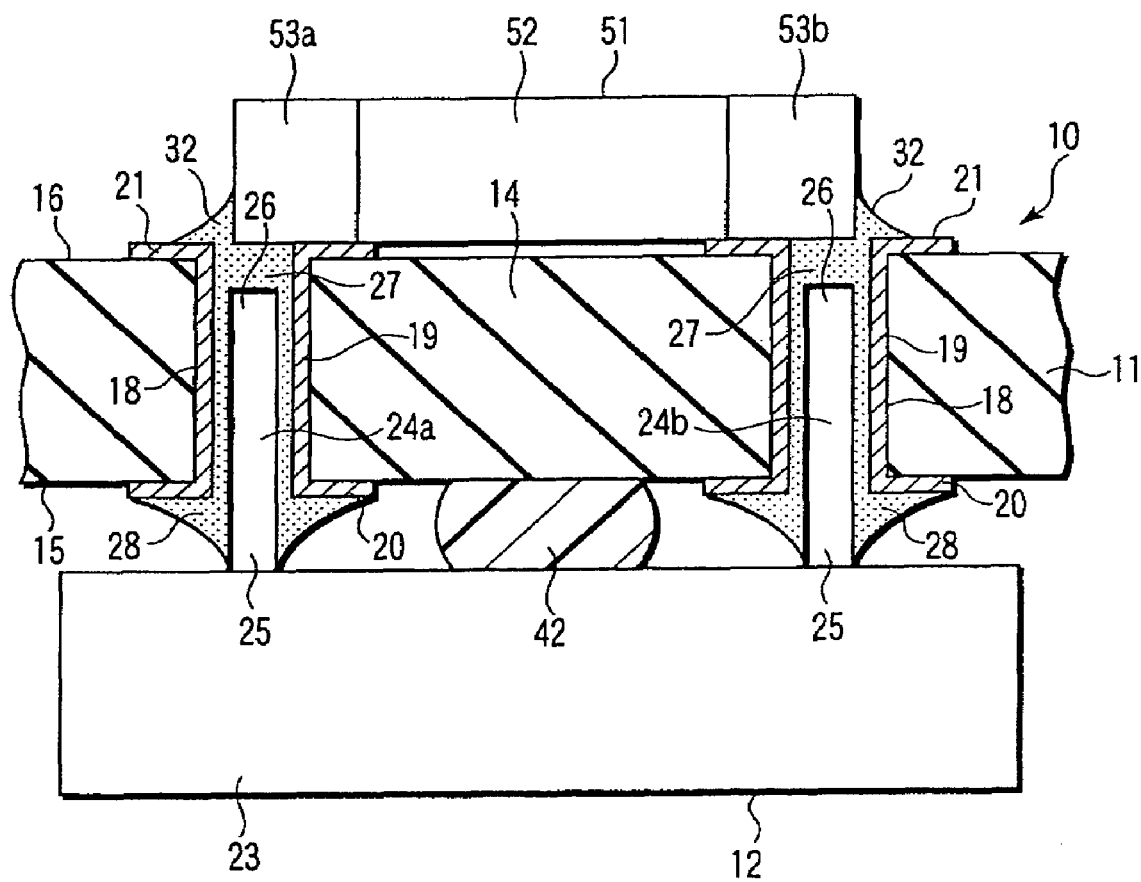
FIG. 11 is an exemplary sectional view of a printed circuit board according to a third embodiment of the present invention.

FIG. 11 shows a printed circuit board 10 according to a third embodiment of the present invention.

The third embodiment differs from the first and second embodiments in the method of mounting surface mount devices 51 on the printed wiring board 11. In any other respects the printed circuit board 10 is identical to that of the first embodiment.

As shown in FIG. 11, each surface mount device 51 has a main body 52, a first electrode 53a, and a second electrode 53b. The surface mount device 51 is large enough to cover two adjacent through holes 18.

The main boy 52 lies at that part of the printed wiring board 11 that lie between the two through holes 18. The first electrode 53a is provided on one end of the main body 52 and reflow-soldered to a land 21 that is provided on the rim of one through hole 18 into which the lead 24a of a through-hole mount device 12 is to be inserted. The second electrode 53b is provided on the other end of the main body 52 and reflow-soldered to a land 21 that is provided on the rim of the other through hole 18 into which the lead 24b of the through-hole mount device 12 is to be inserted. The first and second electrodes 53a and 53b close the two through holes 18, respectively, at the second surface 16 of the printed wiring board 11.

In the third embodiment, the leads 24a and 24b of each through-hole mount device 12 lie in two through holes 18, respectively. Thus, the first and second electrodes 53a and 53b of each surface mount device 13 can be soldered to two lands 21, closing those ends of the through holes 18 which open at the second surface 16 of the printed wiring board 11. Namely, these ends of the through holes 18 are used as mounting regions for the first and second electrodes 53a and 53b, respectively.

In the present invention, the surface mount devices are not limited to chip capacitors. Instead, they may be other chip components or small-outline packages (SOPs). The through-hole mount devices are not limited to sockets and may be, for example, PGA-type semiconductor packages.

Moreover, the electronic apparatus according to the present invention is not limited to a portable computer. This invention can be applied to, for example, a personal digital assistant.

While certain embodiments of the inventions have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A printed circuit board comprising:
   a wiring board including a first surface, a second surface opposite to the first surface, and a plurality of through holes opened in the first and second surfaces;
   a through-hole mount device including a plurality of leads inserted in the through holes, the through-hole mount device being mounted on the first surface of the wiring board by soldering the leads inside the through holes, the leads having distal ends positioned inside the through holes;
   an adhesive filling a gap between the first surface of the wiring board and the through-hole mount device, the adhesive fixing the through-hole mount device to the first surface of the wiring board; and
   a surface mount device which is soldered to the second surface of the wiring board and which closes the through holes in which the leads are inserted.

2. The printed circuit board according to claim 1, wherein the adhesive is coated on that region of the first surface on which the through-hole mount device is mounted.

3. The printed circuit board according to claim 2, wherein the adhesive is located between adjacent ones of the leads.

4. The printed circuit board according to claim 2, wherein the adhesive is located between adjacent ones of the through holes.

5. The printed circuit board according to claim 2, wherein the adhesive is located between soldering sections by which the leads are soldered to the through holes.

6. The printed circuit board according to claim 1, wherein the distal ends of the leads located inside the through holes are away from the through-hole mount device.

7. The printed circuit board according to claim 6, wherein solder fills a gap between the distal ends of the leads and the through-hole mount device.

8. The printed circuit board according to claim 7, wherein the wiring board has lands surrounding the through holes and electrically connected to the through holes, and the surface mount device is soldered to the lands.

9. An electronic apparatus comprising:
   a housing; and
   a printed circuit board which is provided in the housing and which includes:
   a wiring board including a first surface, a second surface opposite to the first surface, and a plurality of through holes opened in the first and second surfaces;
   a through-hole mount device including a plurality of leads inserted in the through holes, the through-hole mount device being mounted on the first surface of the wiring board by soldering the leads inside the through holes, the leads having distal ends positioned inside the through holes;
   an adhesive filling a gap between the first surface of the wiring board and the through-hole mount device, the adhesive fixing the through-hole mount device to the first surface of the wiring board; and
   a surface mount device which is soldered to the second surface of the wiring board and which closes the through holes in which the leads are inserted.

* * * * *